United States Patent
Zhang et al.

(10) Patent No.: US 12,394,592 B2
(45) Date of Patent: Aug. 19, 2025

(54) METHOD FOR ENHANCING DISCHARGE IN MAGNETIZED CAPACITIVELY COUPLED RADIO FREQUENCY (CCRF) DISCHARGE REACTOR

(71) Applicant: Dalian University of Technology, Dalian (CN)

(72) Inventors: Quanzhi Zhang, Dalian (CN); Jingyu Sun, Dalian (CN); Yuqing Guo, Dalian (CN); Younian Wang, Dalian (CN)

(73) Assignee: Dalian University of Technology, Dalian (CN)

( * ) Notice: Subject to any disclaimer, the term of this patent is extended or adjusted under 35 U.S.C. 154(b) by 572 days.

(21) Appl. No.: 17/950,181

(22) Filed: Sep. 22, 2022

(65) Prior Publication Data

US 2023/0146702 A1  May 11, 2023

(30) Foreign Application Priority Data

Sep. 22, 2021 (CN) .......................... 202111104982.5

(51) Int. Cl.
*H01J 37/32* (2006.01)

(52) U.S. Cl.
CPC ..... *H01J 37/32091* (2013.01); *H01J 37/3211* (2013.01); *H01J 37/32183* (2013.01)

(58) Field of Classification Search
CPC ............. H01J 37/32091; H01J 37/3211; H01J 37/32183
See application file for complete search history.

(56) References Cited

U.S. PATENT DOCUMENTS 4,310,759 A * 1/1982 Oechsner ................ C23C 14/00
250/281
5,505,780 A * 4/1996 Dalvie .............. H01J 37/32678
156/345.46

(Continued)

FOREIGN PATENT DOCUMENTS

CN  101366101 A * 2/2009 ............ H01J 37/321
CN  108648981  10/2018

(Continued)

*Primary Examiner* — Adam D Houston
(74) *Attorney, Agent, or Firm* — Whiteford, Taylor & Preston, LLP; Peter J. Davis (57) ABSTRACT

The present disclosure relates to the field of semiconductor die etching technologies, and discloses a method for enhancing discharge in a magnetized capacitively coupled radio frequency (CCRF) discharge reactor, including: constructing a magnetized CCRF discharge reactor; and adjusting magnetic induction intensity of the magnetized CCRF discharge reactor, to enable the magnetic induction intensity to meet a relation $B=(\pi \cdot m_c)/e \cdot f_{rf}$, where in the formula, B represents the magnetic induction intensity of the magnetized CCRF discharge reactor, $\pi$ represents a circumference, $m_c$ represents an electron mass, e represents an elementary charge, and $f_{rf}$ represents an RF frequency. In the present disclosure, power coupling efficiency can be greatly enhanced, and plasma density can be greatly increased.

8 Claims, 4 Drawing Sheets

(56) References Cited

U.S. PATENT DOCUMENTS

| | | | | |
|---|---|---|---|---|
| 5,849,372 A * | 12/1998 | Annaratone | ...... | H01J 37/32027 |
| | | | | 118/723 E |
| 6,022,460 A * | 2/2000 | O | .......... | H01J 37/321 |
| | | | | 204/298.34 |
| 9,500,446 B2 * | 11/2016 | Crouch | .................. | H01Q 9/28 |
| 10,037,867 B2 * | 7/2018 | Godyak | ............... | H01J 37/3211 |
| 11,253,718 B2 * | 2/2022 | Prouza | .................. | A61N 2/008 |
| 11,491,342 B2 * | 11/2022 | Ladman | .................. | A61N 2/02 |
| 12,048,910 B2 * | 7/2024 | Fan | ...................... | B01J 19/006 |
| 12,243,718 B2 * | 3/2025 | Kamata | .................. | H05H 1/46 |
| 2004/0118344 A1* | 6/2004 | Ni | .................... | H01J 37/32577 |
| | | | | 118/723 E |
| 2010/0230053 A1* | 9/2010 | Nishio | ............. | H01J 37/32678 |
| | | | | 156/345.49 |
| 2012/0160806 A1* | 6/2012 | Godyak | ............... | H01J 37/321 |
| | | | | 216/61 |
| 2015/0053553 A1* | 2/2015 | Ando | ................. | H01J 37/321 |
| | | | | 156/345.48 |
| 2016/0035546 A1* | 2/2016 | Platt | ................. | H01J 37/32669 |
| | | | | 204/192.12 |
| 2016/0228844 A1* | 8/2016 | Mededovic | .............. | H05H 1/24 |
| 2020/0013594 A1* | 1/2020 | Lane | ................ | H01J 37/32678 |
| 2020/0381224 A1* | 12/2020 | Ikeda | ................ | H01J 37/32275 |
| 2023/0146702 A1* | 5/2023 | Zhang | ................ | H01J 37/3266 |
| | | | | 156/345.48 |
| 2023/0360893 A1* | 11/2023 | Son | ........................ | H01F 27/24 |
| 2025/0037977 A1* | 1/2025 | Lane | ................ | H01J 37/32715 |

FOREIGN PATENT DOCUMENTS

| | | | | | |
|---|---|---|---|---|---|
| CN | 108648981 | A | * | 10/2018 | .............. H01J 49/20 |
| CN | 114236629 | A | * | 3/2022 | ............... G01V 7/00 |
| CN | 117788630 | A | * | 3/2024 | |
| CN | 118213255 | A | * | 6/2024 | ........ H01J 37/32174 |
| CN | 118526182 | A | * | 8/2024 | ............. G06F 17/14 |
| CN | 118859347 | A | * | 10/2024 | ............. G06N 3/006 |
| CN | 119584406 | A | * | 3/2025 | |
| EP | 1444874 | B1 | * | 4/2015 | ........ H01J 37/32678 |
| JP | 2776855 | B2 | * | 7/1998 | .............. H01J 27/18 |
| JP | 2008159928 | A | * | 7/2008 | ............. H10D 62/50 |
| JP | 2009277889 | A | * | 11/2009 | ......... H01J 37/32935 |
| JP | 2010166011 | A | * | 7/2010 | ........ H01L 21/3065 |
| KR | 20230084426 | A | * | 6/2023 | ........ H01J 37/32091 |
| WO | WO-2025095778 | A1 | * | 5/2025 | ............ B01J 19/088 |

\* cited by examiner

METHOD FOR ENHANCING DISCHARGE IN MAGNETIZED CAPACITIVELY COUPLED RADIO FREQUENCY (CCRF) DISCHARGE REACTOR

CROSS REFERENCE TO RELATED APPLICATION(S)

This patent application claims the benefit and priority of Chinese Patent Application No. 202111104982.5, filed on Sep. 22, 2021, the disclosure of which is incorporated by reference herein in its entirety as part of the present application.

TECHNICAL FIELD

The present disclosure relates to the field of semiconductor die etching technologies and in particular, to a method for enhancing discharge in a magnetized capacitively coupled radio frequency (CCRF) discharge reactor.

BACKGROUND ART

As a characteristic size of a semiconductor die continuously decreases, an etching high-depth-ratio increases continuously. To generate directional moving ions with high energy and reduce a collision probability between the ions and background gas, a very low atmospheric pressure (less than 10 mTorr) is required in a plasma etching process. At such a low atmospheric pressure, the power coupling efficiency of a plasma is usually very low, and it is difficult to maintain discharge.

Currently, a magnetized CCRF discharge reactor is mainly used for etching the semiconductor die. When the magnetized CCRF discharge reactor operates at a low atmospheric pressure less than 10 mTorr, the power coupling efficiency of the plasma is very low, and it is difficult to maintain discharge. Therefore, a method for enhancing discharge in a magnetized CCRF discharge reactor is urgently needed in the art, so as to greatly enhance power coupling efficiency and greatly increase plasma density.

SUMMARY

The present disclosure aims to provide a method for enhancing discharge in a magnetized CCRF discharge reactor, so as to greatly enhance power coupling efficiency and greatly increase plasma density.

To achieve the above objective, the present disclosure provides the following technical solutions:

A method for enhancing discharge in a magnetized CCRF discharge reactor is provided. The method includes:
constructing a magnetized CCRF discharge reactor; and
adjusting magnetic induction intensity of the magnetized CCRF discharge reactor, to enable the magnetic induction intensity to meet a relation $B=(\pi \cdot m_e)/e \cdot f_{rf}$, where in the formula, B represents the magnetic induction intensity of the magnetized CCRF discharge reactor, $\pi$ represents a circumference, $m_e$ represents an electron mass, e represents an elementary charge, and $f_{rf}$ represents an RF frequency.

Optionally, the magnetized CCRF discharge reactor specifically includes an RF power supply, a first Helmholtz coil, a second Helmholtz coil, a third Helmholtz coil, a fourth Helmholtz coil, a powered electrode, a grounded electrode, and a plasma discharge chamber;
the powered electrode and the grounded electrode are arranged parallel to each other in the plasma discharge chamber; one terminal of the RF power supply is connected to the powered electrode; the other terminal of the RF power supply is grounded; both the grounded electrode and the plasma discharge chamber are grounded; the RF power supply is configured to provide an RF voltage and an RF frequency for the powered electrode; the RF voltage and the RF frequency are used to generate an RF alternating electric field between the powered electrode and the grounded electrode; and the RF alternating electric field is used to break down gas in the plasma discharge chamber to form glow discharge to generate a plasma;
the first Helmholtz coil and the second Helmholtz coil are separately disposed on two sides of the plasma discharge chamber; and the first Helmholtz coil and the second Helmholtz coil are configured to generate a first magnetic induction intensity distribution parallel to the powered electrode; and
the third Helmholtz coil and the fourth Helmholtz coil are separately disposed on the two sides of the plasma discharge chamber; the third Helmholtz coil and the fourth Helmholtz coil are configured to generate a second magnetic induction intensity distribution parallel to the grounded electrode; and the first magnetic induction intensity distribution and the second magnetic induction intensity distribution together constitute the magnetic induction intensity of the magnetized CCRF discharge reactor.

Optionally, the magnetized CCRF discharge reactor further includes a matching network; and
the matching network is separately connected to the RF power supply and the powered electrode, and the RF voltage is loaded on the powered electrode through the matching network.

Optionally, a gap between the powered electrode and the grounded electrode is between 1 cm and 5 cm.

Optionally, the plasma chamber is internally a confined space.

Optionally, the magnetized CCRF discharge reactor further includes an external gas supply system; and
the external gas supply system is configured to supply gas to the plasma chamber.

Optionally, the adjusting magnetic induction intensity of the magnetized CCRF discharge reactor, to enable the magnetic induction intensity to meet a relation $B=(\pi \cdot m_e)/e \cdot f_{rf}$, specifically includes:
adjusting currents of the first Helmholtz coil, the second Helmholtz coil, the third Helmholtz coil, and the fourth Helmholtz coil, to enable the magnetic induction intensity of the magnetized CCRF discharge reactor meets the relation $B=(\pi \cdot m_e)/e \cdot f_{rf}$.

Optionally, the RF frequency is in a range of 10 MHz to 60 MHz.

According to the specific embodiments provided by the present disclosure, the present disclosure discloses the following technical effects:

According to the method for enhancing discharge in a magnetized CCRF discharge reactor disclosed in the present disclosure, the magnetic induction intensity of the magnetized CCRF discharge reactor is adjusted, to enable the magnetic induction intensity to meet the relation $B=(\pi \cdot m_e)/e \cdot f_{rf}$. When the magnetic field intensity and the RF frequency meet the matching relation $B=(\pi \cdot m_e)/e \cdot f_{rf}$, an electron that performs a periodic circular motion under a constraint of a magnetic field interacts with an RF sheath on which a periodic oscillation occurs. A cyclotron electron continuously obtains a sheath acceleration therefrom. This effectively enhances stochastic heating efficiency excited by an RF sheath oscillation, and further greatly improves the power coupling efficiency and increases the plasma density, to enhance the discharge in the magnetized CCRF discharge reactor.

BRIEF DESCRIPTION OF THE DRAWINGS

To describe the embodiments of the present disclosure or the technical solutions in the prior art more clearly, the accompanying drawings required in the embodiments are briefly introduced below. Obviously, the accompanying drawings described below are only some embodiments of the present disclosure. A person of ordinary skill in the art may further obtain other accompanying drawings based on these accompanying drawings without creative labor.

DETAILED DESCRIPTION OF THE EMBODIMENTS

The technical solutions of the embodiments of the present disclosure are clearly and completely described below with reference to the accompanying drawings. Apparently, the described embodiments are merely a part rather than all of the embodiments of the present disclosure. All other embodiments obtained by those of ordinary skill in the art based on the embodiments of the present disclosure without creative efforts shall fall within the protection scope of the present disclosure.

The present disclosure aims to provide a method for enhancing discharge in a magnetized CCRF discharge reactor, so as to greatly enhance power coupling efficiency and greatly increase plasma density.

To make the above-mentioned objective, features, and advantages of the present disclosure clearer and more comprehensible, the present disclosure will be further described in detail below in conjunction with the accompanying drawings and specific embodiments.

Figure 1:
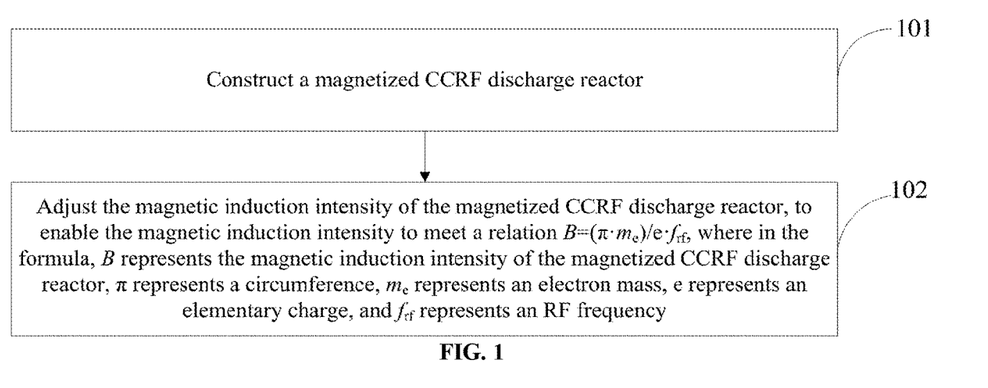
FIG. 1 is a flowchart of an embodiment of a method for enhancing discharge in a magnetized CCRF discharge reactor according to the present disclosure.

FIG. 1 is a flowchart of an embodiment of a method for enhancing discharge in a magnetized CCRF discharge reactor according to the present disclosure. Referring to FIG. 1, the method for enhancing discharge in a magnetized CCRF discharge reactor includes:

Step 101: Construct a magnetized CCRF discharge reactor.

Step 102: Adjust the magnetic induction intensity of the magnetized CCRF discharge reactor to enable the magnetic induction intensity to meet a relation $B=(\pi \cdot m_e)/e \cdot f_{rf}$, where in the formula, B represents the magnetic induction intensity of the magnetized CCRF discharge reactor, $\pi$ represents a circumference, $m_e$ represents an electron mass, e represents an elementary charge, and $f_{rf}$ represents an RF frequency.

Figure 2:
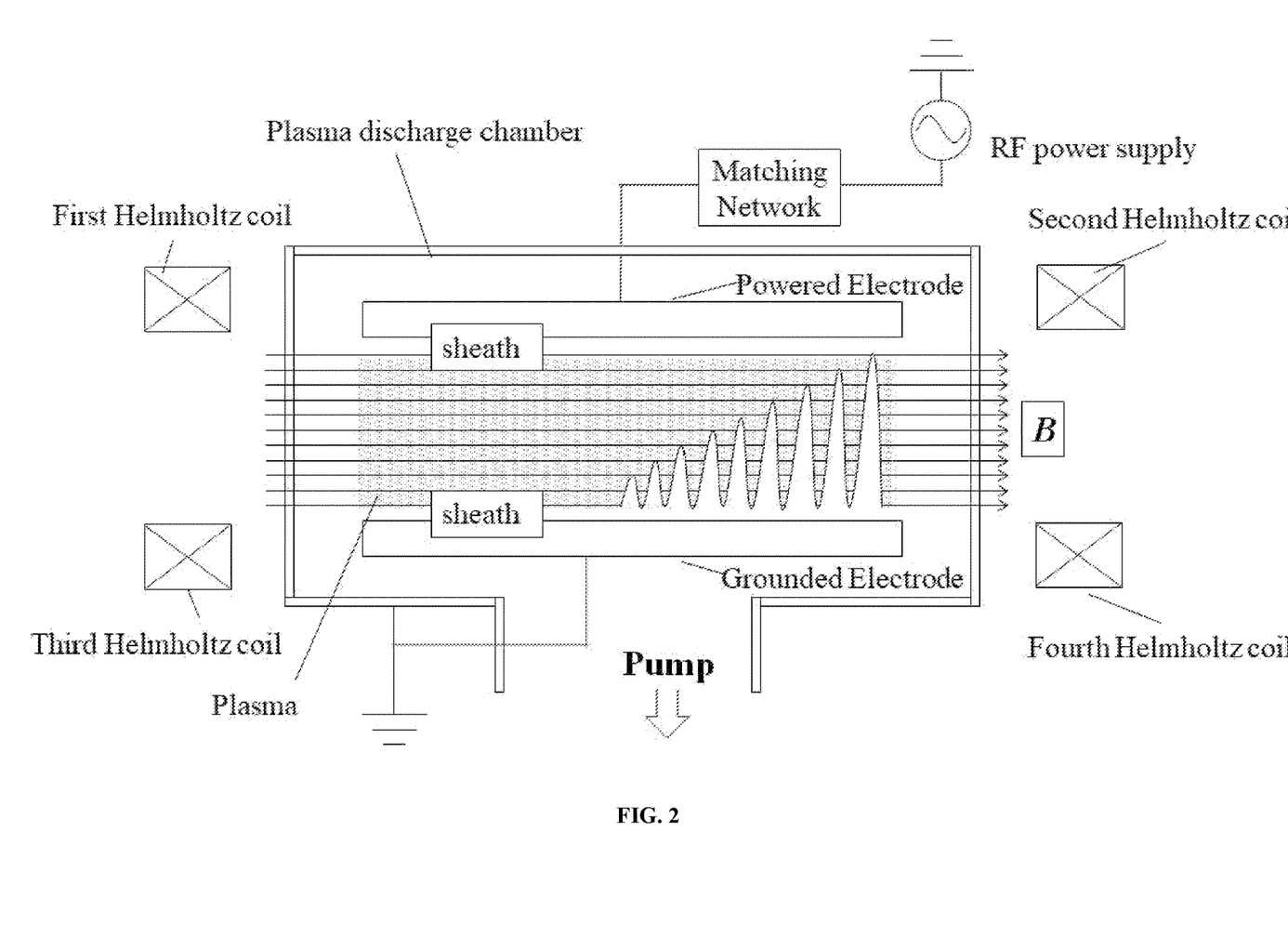
FIG. 2 is a schematic diagram of a structure of a magnetized CCRF discharge reactor according to the present disclosure.

In step 101, the magnetized CCRF discharge reactor specifically includes an RF power supply, a first Helmholtz coil, a second Helmholtz coil, a third Helmholtz coil, a fourth Helmholtz coil, a powered electrode, a grounded electrode, and a plasma discharge chamber. Refer to FIG. 2.

The powered electrode and the grounded electrode are arranged parallel to each other in the plasma discharge chamber. In this embodiment, a gap between the powered electrode and the grounded electrode is between 1 cm and 5 cm. One terminal of the RF power supply is connected to the powered electrode. The other terminal of the RF power supply is grounded. Both the grounded electrode and the plasma discharge chamber are grounded. The plasma chamber is internally a confined space. The RF power supply is configured to provide an RF voltage and an RF frequency for the powered electrode. The RF voltage and the RF frequency are used to generate an RF alternating electric field between the powered electrode and the grounded electrode. In this embodiment, the RF frequency is in a range of 10 MHz to 60 MHz. The RF alternating electric field is used to break down gas in the plasma discharge chamber to form glow discharge to generate a plasma.

The first Helmholtz coil and the second Helmholtz coil are separately disposed on two sides of the plasma discharge chamber. The first Helmholtz coil and the second Helmholtz coil are configured to generate a first magnetic induction intensity distribution parallel to the powered electrode.

The third Helmholtz coil and the fourth Helmholtz coil are separately disposed on the two sides of the plasma discharge chamber. The third Helmholtz coil and the fourth Helmholtz coil are configured to generate a second magnetic induction intensity distribution parallel to the grounded electrode. The first magnetic induction intensity distribution and the second magnetic induction intensity distribution together constitute the magnetic induction intensity of the magnetized CCRF discharge reactor.

Specifically, the magnetized CCRF discharge reactor further includes a matching network and an external gas supply system. The matching network is separately connected to the RF power supply and the powered electrode. The RF voltage is loaded on the powered electrode through the matching network. The external gas supply system is configured to supply gas to the plasma chamber.

In the magnetized CCRF discharge reactor, the Helmholtz coil is configured to generate a stable direct current (DC) magnetic field B. A magnetic line is represented by a dashed arrow in FIG. 2. The RF power supply ($V_{rf}$) is loaded on the powered electrode through the matching network. Both the grounded electrode and the plasma discharge chamber are grounded.

Step 102 specifically includes:

Adjust currents of the first Helmholtz coil, the second Helmholtz coil, the third Helmholtz coil, and the fourth Helmholtz coil, to enable the magnetic induction intensity of the magnetized CCRF discharge reactor meets the relation $B=(\pi \cdot m_e)/e \cdot f_{rf}$.

The following describes the technical solutions of the present disclosure by using a specific embodiment.

Figure 3:
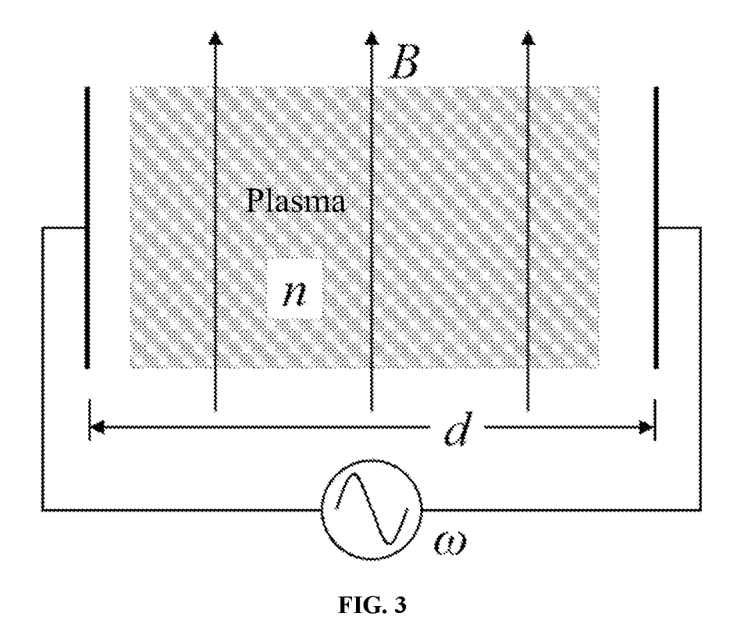
FIG. 3 is a brief schematic diagram of a magnetized CCRF discharge reactor according to the present disclosure.

The present disclosure provides a method for enhancing discharge in an RF magnetized plasma. According to the method, during RF discharge, for example, a magnetic field distribution shown in FIG. 3 is constructed inside a plasma discharge chamber of a capacitively coupled discharge apparatus (a magnetized CCRF discharge reactor is based on the capacitively coupled discharge apparatus with an added magnetic field) and parallel to plates (a powered electrode and a grounded electrode). In FIG. 3, n represents a plasma quantity, d represents a distance between the powered electrode and the grounded electrode, and ω represents an angular frequency ($\omega=2\pi f_{rf}$). When a magnetic field intensity B and an RF frequency $f_{rf}$ roughly meet a relation $B=(\pi \cdot m_e)/e \cdot f_{rf}$, power coupling efficiency of an RF power supply for driving discharge can be greatly improved. This is especially beneficial for the magnetized CCRF discharge reactor in FIG. 3 to generate a high-density plasma during low-pressure discharge. In the matching relation $B=(\pi \cdot m_e)/e \cdot f_{rf}$ of the magnetic field intensity and the RF frequency, B is magnetic induction intensity of the magnetized CCRF discharge reactor, and a unit thereof is Gs (1 Gs=$10^{-4}$ T), $m_e$ is an electron mass and a unit thereof is kg, e is an elementary charge and a unit thereof is C, and $f_{rf}$ is an RF frequency and a unit thereof is Hz. The RF power supply is a plasma auxiliary power supply, and includes an RF power source, an impedance matcher, and an impedance power meter. The RF frequency $f_{rf}$ refers to an RF frequency of the RF power supply, that is, a frequency of the RF power source. During capacitive coupling discharge, there is a capacitive sheath (an RF sheath) at a boundary between the plasma and the electrode, and RF oscillation also occurs in the capacitive sheath. Strong electric field exists in the capacitive sheath.

The foregoing method for enhancing discharge in an RF magnetized plasma specifically includes the following steps:

Step 1: Construct an RF discharge apparatus. The RF discharge apparatus is the foregoing magnetized CCRF discharge reactor.

Step 2: Use a magnet or a charged Helmholtz coil in the RF discharge apparatus, to generate a magnetic field distribution parallel to the plate. Place a pair of magnets or charged Helmholtz coils separately on two sides of the plasma discharge chamber, so that a magnetic line passes through the RF discharge apparatus.

Step 3: For an RF frequency $f_{rf}$, adjust a magnetic field intensity B according to the formula $B=(\pi \cdot m_e)/e \cdot f_{rf}$. Adjust a magnetic induction intensity B passing through the plasma discharge chamber by adjusting a current of the Helmholtz coil or a location of the magnet or in another manner, so that B meets the matching relation $B=(\pi \cdot m_e)/e \cdot f_{rf}$.

Step 4: When the magnetic field intensity B and the RF frequency $f_{rf}$ meet the specific relation $B=(\pi \cdot m_e)/e \cdot f_{rf}$, cyclotron electrons (an electron in the plasma performs a cyclotron motion in the added magnetic field, that is, a cyclotron electron in the plasma) are resonantly heated by the RF sheath (a plasma sheath generated in the capacitive coupling discharge apparatus), so as to greatly enhance power coupling efficiency and greatly increase plasma density. It can be learned from FIG. 4 that electron densities obtained by experiment (Exp.) and simulation (Sim.) vary with the magnetic field intensity. When the RF source frequency (RF frequency) $f_{rf}$ is 27.12 MHz, the matched resonance magnetic induction intensity B is about 4.8 Gs. It can be seen intuitively from FIG. 4 that electron density near 4.8 Gs is significantly enhanced.

Figure 4:
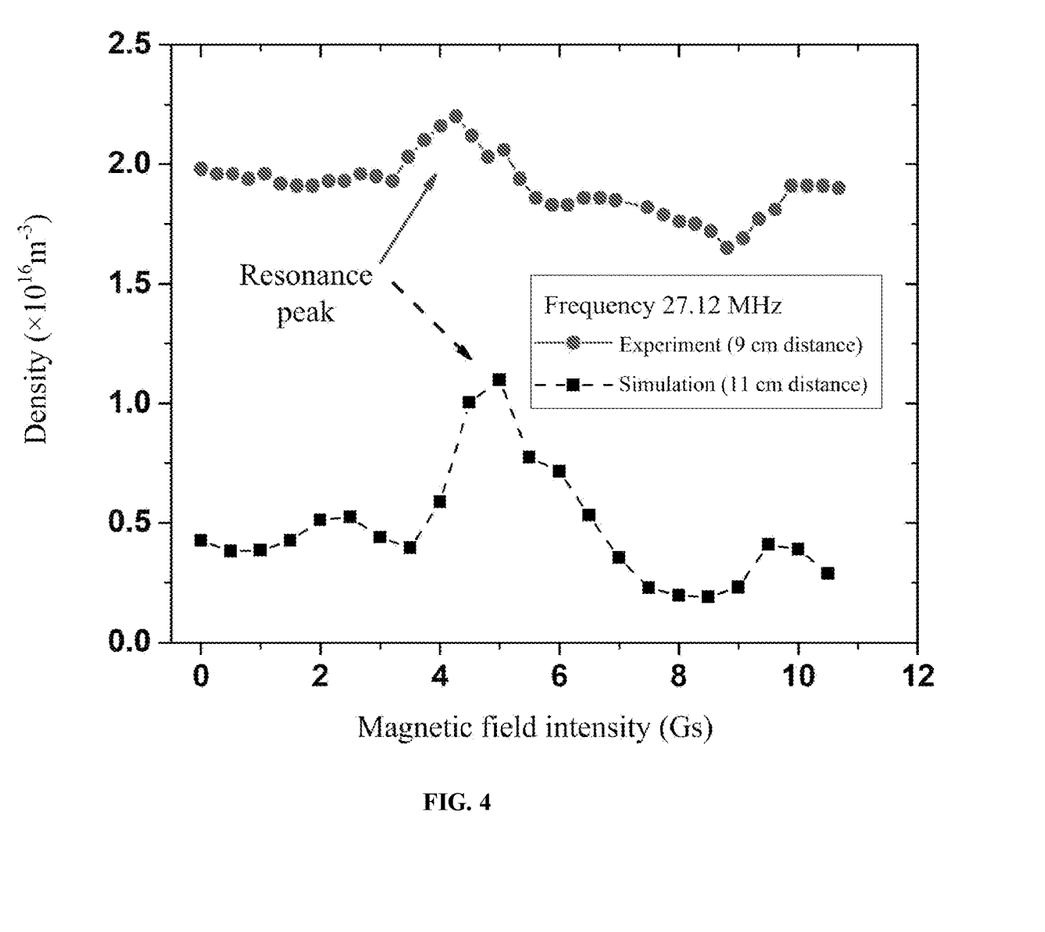
FIG. 4 is a schematic diagram of plasma density change with magnetic field intensity according to the present disclosure.

A working principle of the present disclosure is specifically as follows:

The present disclosure aims to adjust a magnitude of the magnetic field by using the apparatus shown in FIG. 2 to meet the formula $B=(\pi \cdot m_e)/e \cdot f_{rf}$, so as to enhance plasma density. An apparatus structure, that is, a product structure, is shown in FIG. 2. The RF power supply is used to generate the RF alternating electric field inside the two electrodes (the powered electrode and the grounded electrode), to break down working gas to form a stable glow discharge to generate the plasma. A stable static magnetic field is generated outside a plasma source (if an Helmholtz coil is removed, a basic capacitively coupled plasma source is obtained, and if an Helmholtz coil is added, a capacitively coupled plasma source with an RF magnetic field is obtained) by using the Helmholtz coil. The magnetic line covers a discharge area (usually, when an electrode distance is 1 cm to 5 cm, the magnetic line is relatively easy to cover such a small discharge gap). The electron inside the plasma may perform a periodic cyclotron motion around the magnetic line, and interact with the sheath on which the RF oscillation occurs. As shown in a wavy line trajectory in FIG. 2, the electron performs the periodic cyclotron motion around the magnetic line. The electrons perform a circular motion under a constraint of the magnetic line. Under a one-dimensional approximation, the electron performs a harmonic motion. When the electron interacts with the sheath on which the RF oscillation occurs, energy exchange occurs. By modulating the magnetic field intensity, the cyclotron electron resonates with the RF sheath, and the electron may obtain continuous acceleration by the sheath electric field. This greatly enhances the power coupling efficiency and significantly increases the plasma density, as shown in FIG. 4.

The RF alternating electric field is formed between the two side electrodes (the powered electrode and the grounded electrode) by applying the RF power supply on one side electrode, that is, the powered electrode.

The plasma discharge chamber needs to be vacuumed by using a pump. Gas (working gas) is supplied to inside the plasma discharge chamber by using the external gas supply system, to stabilize a discharge atmospheric pressure.

The sheath on which the RF oscillation occurs (RF sheath) is a blank area between the plasma and the electrode in FIG. 2.

When the RF source frequency $f_{rf}$ and the added magnetic field B approximately meet the relation $B=(\pi \cdot m_e)/e \cdot f_{rf}$, the plasma density and the power coupling efficiency are greatly enhanced. Therefore, a cyclotron frequency of the electron matches half RF frequency of sheath oscillation. Each time performing a cyclotron motion, the electron interacts with an oppositely expanding sheath (an electric field). Therefore, the electron obtains a sheath acceleration, and a cyclotron radius becomes large, but a cyclotron period remains unchanged, that is, the acceleration effect remains unchanged. Refer to an electronic wavy line trajectory in FIG. 2. Efficiency with which the electron is accelerated is improved, that is, the power coupling efficiency is improved. Therefore, the plasma density is improved.

The method according to the present disclosure has the following advantages:

(1) A chamber structure does not need to be changed. Only a matching relationship between the magnetic field intensity and the RF frequency needs to be adjusted, so that high power coupling efficiency can be implemented.

(2) Within a general RF frequency range (10 MHz to 60 MHz), a required magnetic field intensity is only 2 Gs to 11 Gs, which does not greatly affect distribution uniformity of the plasma.

(3) In a case of constant external parameters, the plasma density can be increased by four to five times at the low atmospheric pressure, which is critical for low-pressure applications.

The following brings the foregoing advantages: When the magnetic field intensity and the RF frequency meet the matching relation $B=(\pi \cdot m_e)/e \cdot f_{rf}$, the electron that performs a periodic circular motion under a constraint of the magnetic field interacts with the RF sheath on which a periodic oscillation occurs. The cyclotron electron continuously obtains the sheath acceleration therefrom. This effectively enhances stochastic heating efficiency excited by an RF sheath oscillation, and further greatly improves the power coupling efficiency and increases the plasma density.

In an actual process chamber (the plasma discharge chamber of the magnetized CCRF discharge reactor), a magnetic field distribution is spatially inhomogeneous. Therefore, the relation $B=(\pi \cdot m_e)/e \cdot f_{rf}$ may be modified to $(1\pm 0.2)\cdot B=(\pi \cdot m_e)/e \cdot f_{rf}$. However, a core formula is still $B=(\pi \cdot m_e)/e \cdot f_{rf}$. Considering that a resonance condition cannot be met due to existence of a spatial homogeneity of the magnetic field, in an actual apparatus, it is necessary to scan a parameter within a specific range to find an optimal magnetic field intensity.

By using the method for enhancing discharge in an RF magnetized plasma in the present disclosure, without changing external parameters (the external parameters that determine the plasma density mainly include input power of a power supply and an atmospheric pressure) and the structure of the magnetized CCRF discharge reactor, the plasma density can be effectively increased by four to five times. This is critical for an application with a low-pressure RF plasma.

According to the method for enhancing discharge in an RF magnetized plasma provided in the present disclosure, the plasma density is improved by adding a proper magnetic field. This is an optimization mainly for a magnetized capacitively coupled discharge apparatus used for die etching, and is mainly used in the magnetized capacitively coupled discharge apparatus to improve the plasma density. In addition, a similar idea may also be applied to an electric propulsion apparatus to improve density. Plasma density can be increased for any discharge apparatus with a same principle. The method for enhancing discharge in an RF magnetized plasma provided in the present disclosure is mainly applied to an application with a low-pressure RF plasma, including a plasma etching material, an RF ion thruster of a satellite, and the like. The RF ion thruster of a satellite usually operates in a low atmospheric pressure. In addition, due to a mass limitation, the satellite thruster can carry a limited gaseous operating material. Consequently, an atmospheric pressure used for generating a plasma by the RF thruster is also very low (less than 0.1 Pa). In particular, a self-priming RF ion thruster operates in a low orbit, and absorbs thin atmosphere near the low orbit as discharge gas, to discharge, accelerate a thrusting ion, and further form recoil. Due to a low discharge atmospheric pressure, it is difficult to maintain discharge, or discharge density is very low, and a thrust force is very weak. By using the method for enhancing discharge in an RF magnetized plasma provided in the present disclosure, an appropriate magnetic field can be applied under a condition of a very low atmospheric pressure and a constant discharge atmospheric pressure and power. Based on a resonance effect, discharge density is increased several times, to enable high-density discharge from the RF ion thruster. This effectively enhances the discharge and the thrust force.

Each example of the present specification is described in a progressive manner, each example focuses on the difference from other examples, and the same and similar parts between the examples may refer to each other.

In this specification, some specific embodiments are used for illustration of the principles and implementations of the present disclosure. The description of the foregoing embodiments is used to help illustrate the method of the present disclosure and the core ideas thereof. In addition, persons of ordinary skill in the art can make various modifications in terms of specific implementations and the scope of application in accordance with the ideas of the present disclosure. In conclusion, the content of the present description shall not be construed as limitations to the present disclosure.

What is claimed is:

1. A method for enhancing discharge in a magnetized capacitively coupled radio frequency (CCRF) discharge reactor, wherein the method comprises:

constructing a magnetized CCRF discharge reactor; and adjusting the magnetic induction intensity of the magnetized CCRF discharge reactor, to enable the magnetic induction intensity to meet a relation $B=(\pi \cdot m_c)/e \cdot f_{rf}$, wherein in the formula, B represents the magnetic induction intensity of the magnetized CCRF discharge reactor, $\pi$ represents a circumference, $m_c$ represents an electron mass, e represents an elementary charge, and $f_{rf}$ represents an RF frequency.

2. The method for enhancing discharge in a magnetized CCRF discharge reactor according to claim 1, wherein the magnetized CCRF discharge reactor specifically comprises an RF power supply, a first Helmholtz coil, a second Helmholtz coil, a third Helmholtz coil, a fourth Helmholtz coil, a powered electrode, a grounded electrode, and a plasma discharge chamber;

the powered electrode and the grounded electrode are arranged parallel to each other in the plasma discharge chamber; one terminal of the RF power supply is connected to the powered electrode; the other terminal of the RF power supply is grounded; both the grounded electrode and the plasma discharge chamber are grounded; the RF power supply is configured to provide an RF voltage and an RF frequency for the powered electrode; the RF voltage and the RF frequency are used to generate an RF alternating electric field between the powered electrode and the grounded electrode; and the RF alternating electric field is used to break down gas in the plasma discharge chamber to form glow discharge to generate a plasma;

the first Helmholtz coil and the second Helmholtz coil are separately disposed on two sides of the plasma discharge chamber; and the first Helmholtz coil and the second Helmholtz coil are configured to generate a first magnetic induction intensity distribution parallel to the powered electrode; and the third Helmholtz coil and the fourth Helmholtz coil are separately disposed on the two sides of the plasma discharge chamber; the third Helmholtz coil and the fourth Helmholtz coil are configured to generate a second magnetic induction intensity distribution parallel to the grounded electrode; and the first magnetic induction intensity distribution and the second magnetic induction intensity distribution together constitute the magnetic induction intensity of the magnetized CCRF discharge reactor.

3. The method for enhancing discharge in a magnetized CCRF discharge reactor according to claim 2, wherein the magnetized CCRF discharge reactor further comprises a matching network; and the matching network is separately connected to the RF power supply and the powered electrode, and the RF voltage is loaded on the powered electrode through the matching network.

4. The method for enhancing discharge in a magnetized CCRF discharge reactor according to claim 2, wherein a gap between the powered electrode and the grounded electrode is between 1 cm and 5 cm.

5. The method for enhancing discharge in a magnetized CCRF discharge reactor according to claim 2, wherein the plasma chamber is internally a confined space.

6. The method for enhancing discharge in a magnetized CCRF discharge reactor according to claim 2, wherein the magnetized CCRF discharge reactor further comprises an external gas supply system; and the external gas supply system is configured to supply gas to the plasma chamber.

7. The method for enhancing discharge in a magnetized CCRF discharge reactor according to claim 2, wherein the adjusting magnetic induction intensity of the magnetized CCRF discharge reactor, to enable the magnetic induction intensity to meet a relation $B=(\pi \cdot m_c)/e \cdot f_{rf}$ specifically comprises:

adjusting currents of the first Helmholtz coil, the second Helmholtz coil, the third Helmholtz coil, and the fourth Helmholtz coil, to enable the magnetic induction intensity of the magnetized CCRF discharge reactor meets the relation $B=(\pi \cdot m_c)/e \cdot f_{rf}$.

8. The method for enhancing discharge in a magnetized CCRF discharge reactor according to claim 1, wherein the RF frequency is in a range of 10 MHz to 60 MHz.

\* \* \* \* \*